US008278214B2

(12) United States Patent
Roy et al.

(10) Patent No.: US 8,278,214 B2
(45) Date of Patent: Oct. 2, 2012

(54) THROUGH MOLD VIA POLYMER BLOCK PACKAGE

(75) Inventors: Mihir K. Roy, Chandler, AZ (US); Islam A. Salama, Chandler, AZ (US); Charavana K. Gurumurthy, Higley, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 12/646,836

(22) Filed: Dec. 23, 2009

(65) Prior Publication Data

US 2011/0147929 A1  Jun. 23, 2011

(51) Int. Cl.
*H01L 21/44* (2006.01)
*H01L 21/48* (2006.01)

(52) U.S. Cl. ........ 438/667; 438/125; 438/127; 438/672; 257/E21.503

(58) Field of Classification Search ............... 438/667, 438/125, 127, 672; 257/E21.503
See application file for complete search history.

(56) References Cited

U.S. PATENT DOCUMENTS

| | | | | |
|---|---|---|---|---|
| 5,157,589 | A * | 10/1992 | Cole et al. | 361/795 |
| 6,271,469 | B1 * | 8/2001 | Ma et al. | 174/521 |
| 7,224,046 | B2 * | 5/2007 | Abe et al. | 257/668 |
| 7,378,745 | B2 * | 5/2008 | Hayashi et al. | 257/778 |
| 7,504,719 | B2 * | 3/2009 | En et al. | 257/700 |
| 7,772,684 | B2 * | 8/2010 | Kuramochi et al. | 257/686 |
| 2002/0020898 | A1 * | 2/2002 | Vu et al. | 257/676 |
| 2003/0141105 | A1 * | 7/2003 | Sugaya et al. | 174/256 |
| 2004/0089470 | A1 | 5/2004 | Shimoto et al. | |
| 2004/0105955 | A1 * | 6/2004 | Ho et al. | 428/101 |
| 2004/0140551 | A1 | 7/2004 | Usui et al. | |
| 2005/0062173 | A1 * | 3/2005 | Vu et al. | 257/787 |
| 2005/0116337 | A1 * | 6/2005 | Chua et al. | 257/723 |
| 2007/0008251 | A1 | 1/2007 | Kohno et al. | |
| 2007/0175025 | A1 | 8/2007 | Tsukamoto et al. | |
| 2007/0216019 | A1 * | 9/2007 | Hsu | 257/700 |
| 2008/0003764 | A1 | 1/2008 | Seh et al. | |

OTHER PUBLICATIONS

Amkor Technology, *Package on Package (POP) Family*, web page at http://www.amkor.com/go/packaging/all-packages/psvfbga/package-on-package-pop-family, Sep. 2008.
Intel Corporation, PCT Notification of Transmittal of International Search Report and Written Opinion mailed Jul. 27, 2011 for PCT/US2010/057436. 10 pages.

* cited by examiner

*Primary Examiner* — Nitin Parekh
(74) *Attorney, Agent, or Firm* — Blakely, Sokoloff, Taylor & Zafman LLP

(57) ABSTRACT

Methods for forming an integrated circuit chip package having through mold vias in a polymer block, and such packages are described. For example, a first interconnect layer may be formed on a molded polymer block, wherein the first interconnect layer comprises first interconnects through a first polymer layer and to the block. Then, at least one second interconnect layer may be formed on the first interconnect layer, wherein the second interconnect layer comprises second interconnects through a second polymer layer and to the first interconnects of the first interconnect layer. Through mold vias may then be formed through the block, into the first interconnect layer, and to the first interconnects. The through mold vias may be filled with solder to form bumps contacting the first interconnects and extending above the block. Other embodiments are also described and claimed.

8 Claims, 11 Drawing Sheets

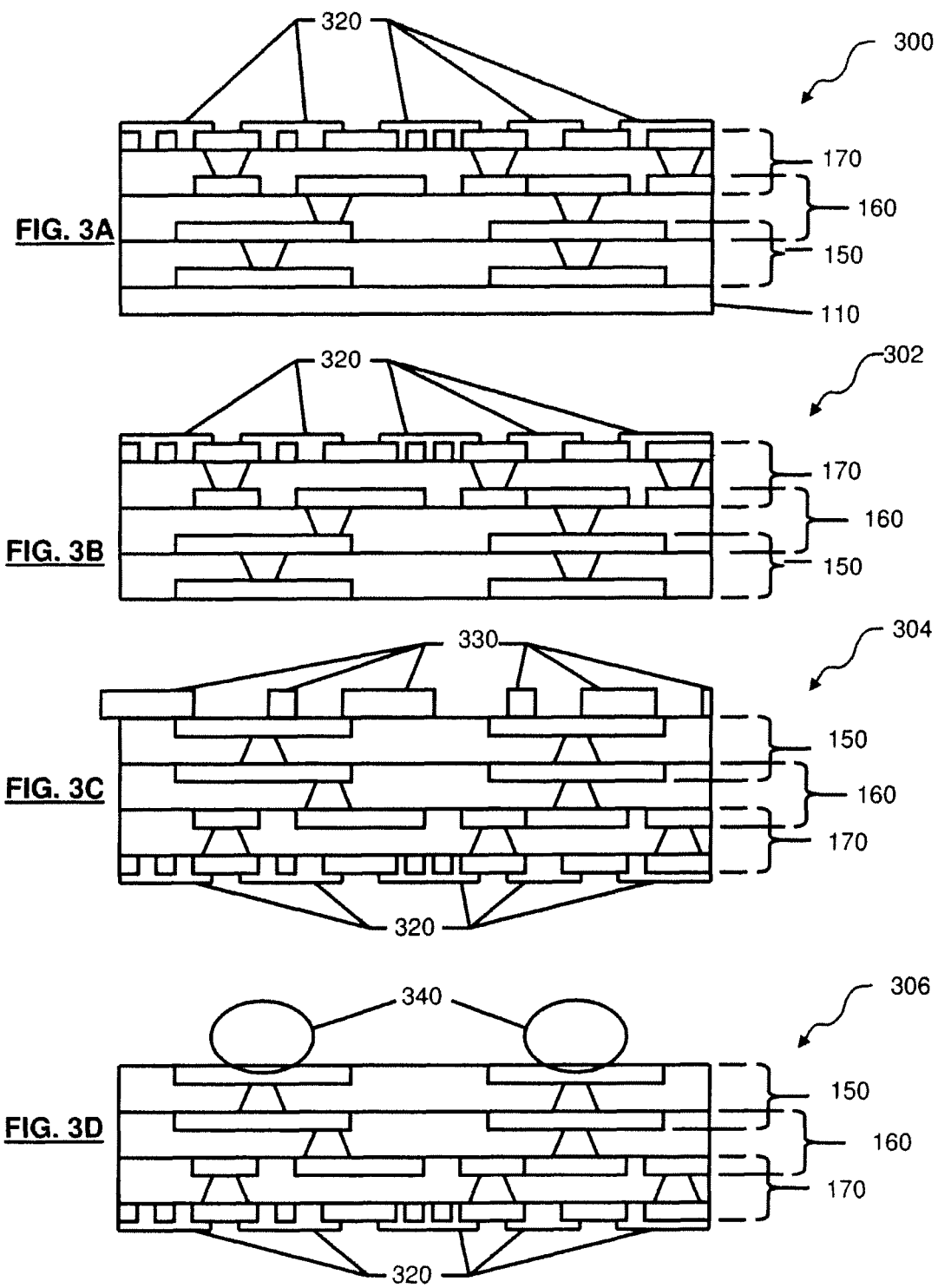

THROUGH MOLD VIA POLYMER BLOCK PACKAGE

Embodiments of the invention are related to integrated circuit (IC) chip packages, such as low height chip packages. Other embodiments are also described.

BACKGROUND

IC chips, such as microprocessors, coprocessors, and the like often use package devices ("packages") to physically and/or electronically attach the IC chip to a circuit board, such as a motherboard (or motherboard interface). For certain devices, such as cell phones, laptop computers, and other thin or small electronic devices, it's desirable to use a low height package, such as a "low Z-height package". To provide a low height package, a "coreless" package may be used such as a package having a thickness no greater than 0.4 mm. Such a coreless package may exclude a support, such as by not having a fiber reinforced polymer support. However, current low height packages suffer drawbacks, such as increased cost, reduced manufacturing rate, and specialized equipment requirements, as compared to improved processes and devices described herein.

For example, some low height coreless packages are manufactured using interconnect layers formed by a polymer, such as ABF, as their dielectric in a direct laser (to form interconnect vias) and lamination (of the polymer) process technology. This manufacturing process is process backend limited and therefore more expensive to manufacture than their "cored" counterparts (e.g. x-2-x, where "x" refers to the build-up layers of the package, "2" refers to the core layers in the package, and 2x is the layer count for the coreless package), despite the coreless packages having two times the productivity. Backend limitations may be due to the more complex build-up layers in the package. In some cases, processing of coreless packages may require forming a cored package and then removing the core so that the package is coreless.

Also, some coreless package processes start with a core followed by pocket formation of conductor openings of the package. One pocket formation that is specific to this type of process technology is known as Direct Laser Lamination (DLL). Since dedicated and completely separate process equipment is needed for pocket formation processes, the package cost is highly driven by the increased cost of these equipment, as well as the lower volume of manufacturing (which is typically very low as the low height package processes are currently considered for only Mobile Internet Device (MID) segments of the industry, such as for handheld internet communication & computing devices).

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 3A shows an embodiment of the package shown in FIG. 1J (and/or a package of FIG. 2) after forming a total of three interconnect layers on the conductor panel.

FIG. 3B shows an embodiment of the package of FIG. 3A after removing the conductor panel.

FIG. 3C shows an embodiments of the package of FIG. 3B after forming constraints on the surface of the interconnect layer exposed by removing the conductor panel.

FIG. 3D shows an embodiment of the package of FIG. 3C after forming solder balls on the contacts exposed by removing the conductor panel.

DETAILED DESCRIPTION

Several embodiments of the invention with reference to the appended drawings are now explained. Whenever the shapes, relative positions and other aspects of the parts described in the embodiments are not clearly defined, the scope of the embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1A:
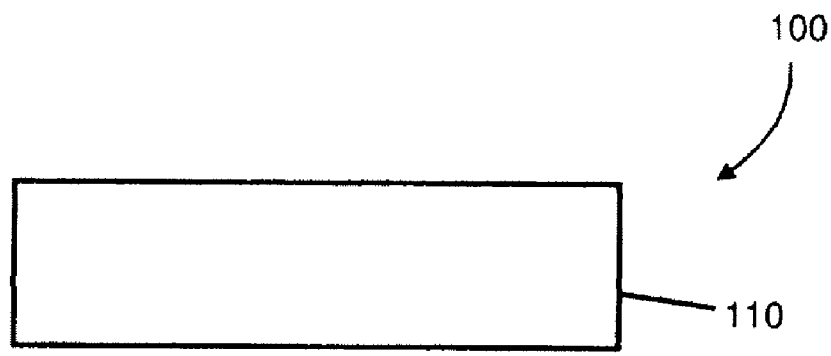
FIG. 1A shows an embodiment of a core or panel upon which interconnect layers of a package are formed.
Figure 1B:
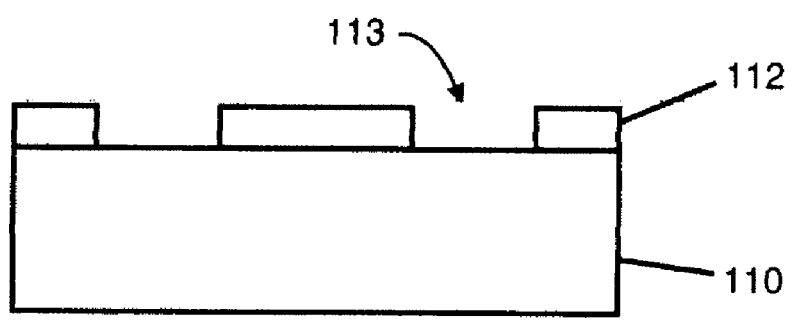
FIG. 1B shows an embodiment of the package of FIG. 1A after resist lamination and patterning.
Figure 1C:
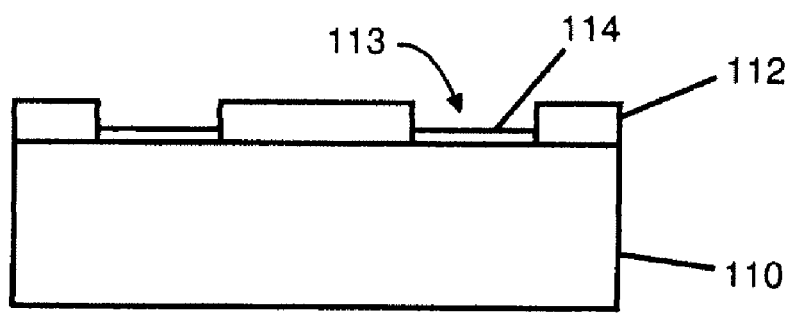
FIG. 1C shows an embodiment of the package of FIG. 1B after forming pockets of conductor within the resist openings.
Figure 1D:
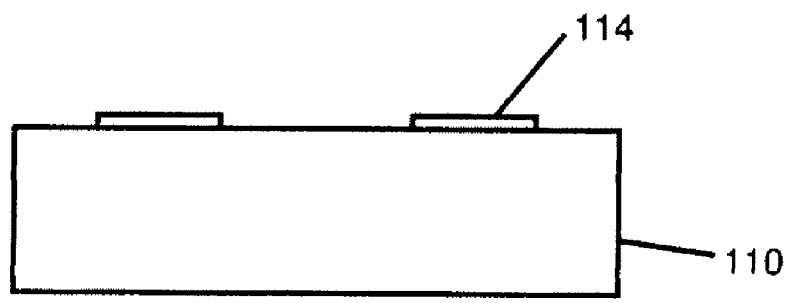
FIG. 1D shows the package of FIG. 1C after stripping the resist.
Figure 1E:
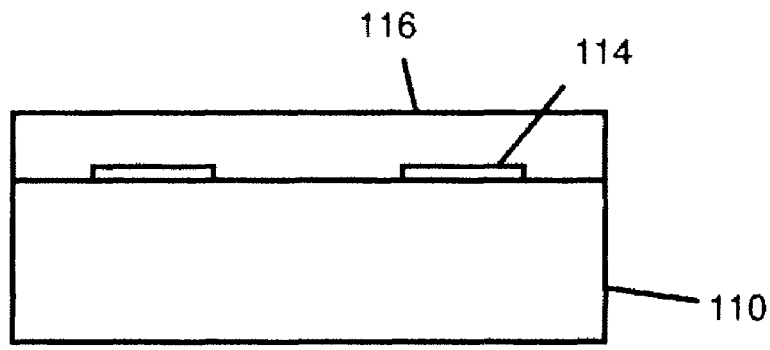
FIG. 1E shows an embodiment of the package of FIG. 1D after polymer lamination over the pockets and panel.
Figure 1F:
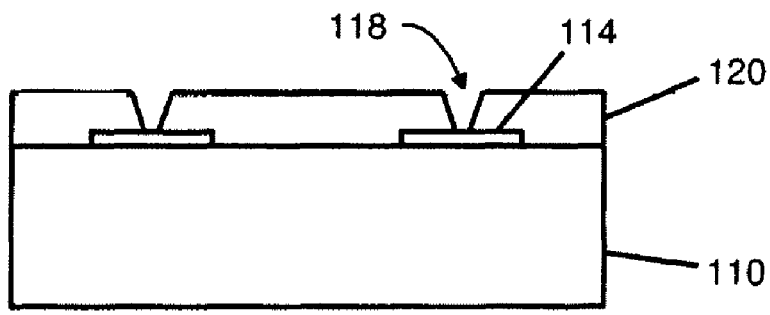
FIG. 1F shows the package of FIG. 1E after forming vias through the polymer lamination.
Figure 1G:
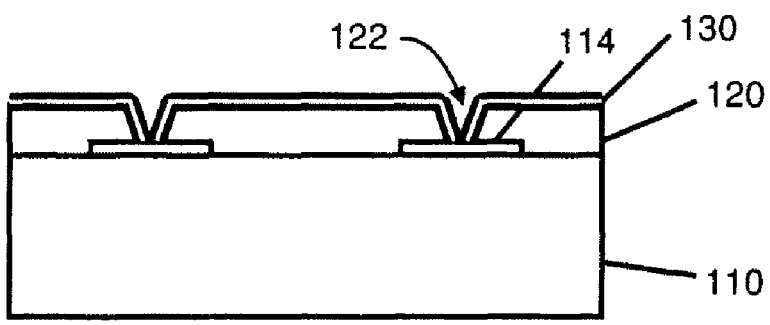
FIG. 1G shows the package of FIG. 1F after forming a conformal layer of conductor over the polymer lamination and in the vias.
Figure 1H:
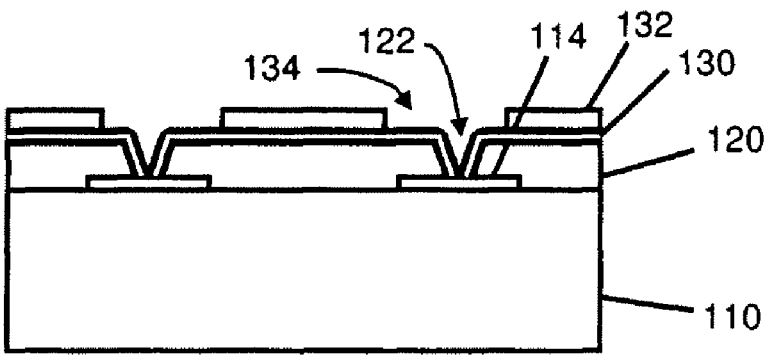
FIG. 1H shows an embodiment of the package of FIG. 1G after further resist lamination and patterning.
Figure 1I:
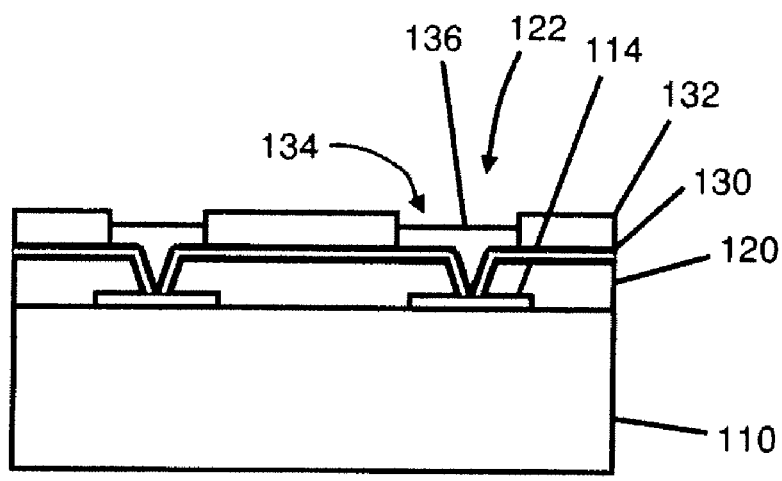
FIG. 1I shows an embodiment of the package of FIG. 1H after forming additional conductive material in openings of the resist to form interconnects.
Figure 1J:
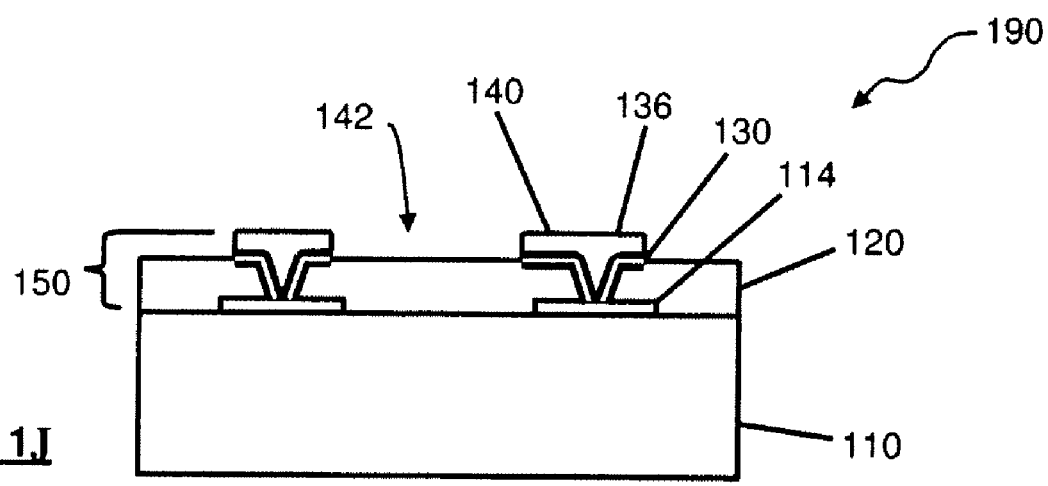
FIG. 1J shows an embodiment of the package of FIG. 1I after removing the resist and sufficient conductor material to expose the polymer layer and form interconnects having exposed contacts and in electrical contact with and touching the pockets.
Figure 2:
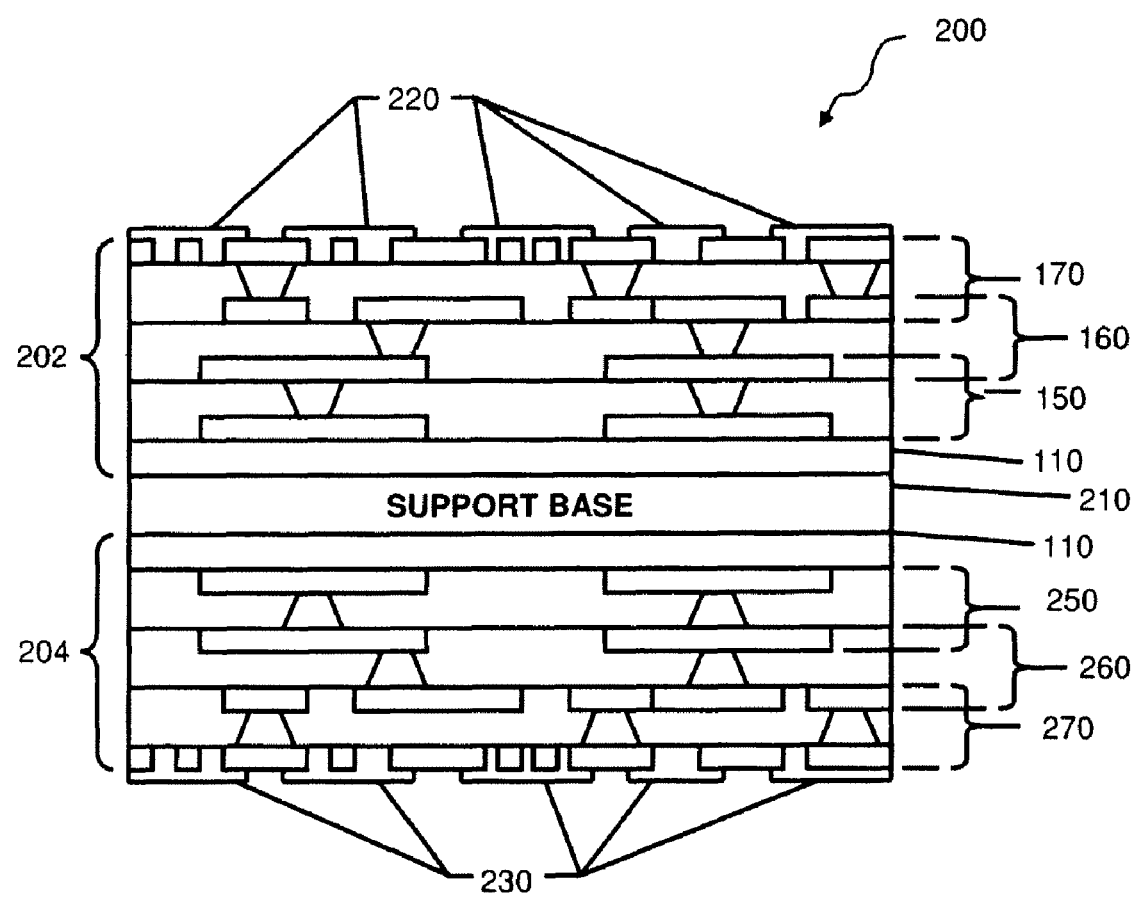
FIG. 2 shows an embodiment of a package having mirror image packages formed on opposing sides of a support base.

FIGS. 1-3 show embodiments of forming electrolytic plated metal contacts on a metal panel, forming interconnect layers above the metal panel and contacts; then removing the metal panel to create an integrated circuit chip package. For example, FIG. 1A shows an embodiment of a core or panel upon which interconnect layers of a package are formed. FIG. 1A shows package 100 (e.g., a low height package) of a coreless package process beginning with conductor material panel 110. In some embodiments, panel 110 may be described as a "core" layer such as a core used when forming a cored package or a coreless package (e.g., the core is subsequently removed). Panel 110 may be a metal such as a copper layer (e.g. rolled, foil, or otherwise formed as known in the art). Appropriate conductors include copper, nickel, silver, gold, palladium, an alloy thereof, and the like as known in the industry. Panel 110 may have a thickness of approximately 35 microns.

FIG. 1B shows an embodiment of the package of FIG. 1A after resist lamination and patterning. In FIG. 1B, panel 110 is laminated with resist 112, which is then etched to form contact openings 113.

Next, FIG. 1C shows an embodiment of the package of FIG. 1B after forming pockets of conductor within the resist openings. In FIG. 1C, the exposed surface of panel 110 within openings 113 is plated with a conductor or metal to form pockets or contacts 114. In some cases, electrolytic plating of metal may be used to form contacts 114. Appropriate conductors include copper, nickel, silver, gold, palladium, an alloy thereof, and the like as known in the industry. For example, the exposed surface of panel 110 may be electrolytic plated with nickel, palladium, gold, or an alloy thereof to form pockets or contacts 114. In some embodiments, contact 114 may be formed by three separate platings of three different metals. For example, contact 114 may be formed by first electrolytic plating nickel onto the surface of panel 110 within openings 113, then electrolytic plating palladium onto the nickel within openings 113, and then electrolytic plating gold onto the palladium within openings 113.

FIG. 1D shows the package of FIG. 1C after stripping the resist. FIG. 1D shows package 100 after resist 112 is stripped or completely etched from the surface of panel 110, thus exposing the conductive pockets and panel surface.

It can be appreciated that, as known in the art, the processes shown in FIGS. 1B-1D to form contacts 114 are expensive as well as time consuming. For example, to form contacts 114 may be expensive with respect to the resources of the plating metals, processing, and may require dedicated and completely separate processing equipment to perform the plating. In some instances, such plating is described as "pocket formation" (e.g. conductive pocket formation) and may be specific to certain processing technologies such as DLL, or other direct laser and lamination formation of metal onto the surface of the panel. The cost of such pockets may also be increased or high due to the low volume of manufacturing, as the low height packages are currently considered for MID segments (e.g., handheld Internet communication & computing devices).

FIGS. 1E-1J describe additional processing for forming the coreless package. Such processing may be common to "cored" as well as "coreless" processes.

FIG. 1E shows an embodiment of the package of FIG. 1D after polymer lamination over the pockets and panel. FIG. 1E shows package 100 after the surface of panel 110 and metal 114 are coated with a polymer lamination 116, such as by ABF lamination, as known in the industry.

FIG. 1F shows the package of FIG. 1E after forming vias through the polymer lamination. FIG. 1F shows forming vias in and through layer 116 and to contacts 114 to create layer 120. For example, vias 118 may be formed by via drilling, such as by laser.

FIG. 1G shows the package of FIG. 1F after forming a conformal layer of conductor over the polymer lamination and in the vias. Forming layer 130 may form via fill opening 122 within via 118 above layer 130. Layer 130 may be filmed by electroless plating, such as to plate a metal. Appropriate conductors include copper, nickel, gold, gold, palladium, an alloy thereof, and the like as known in the industry.

FIG. 1H shows an embodiment of the package of FIG. 1G after further resist lamination and patterning. FIG. 1H shows the surface of layer 130 laminated with resist 132; and resist 132 etched to form interconnect fill openings 134 in layer 132 and above layer 130. Openings 134 include openings 122.

FIG. 1I shows an embodiment of the package of FIG. 1H after forming additional conductive material in openings of the resist to form interconnects. FIG. 1I shows filling openings 134 with a conductive interconnect material to form interconnect. FIG. 1I may represent via fill plating, as known in the industry.

FIG. 1J shows an embodiment of the package of FIG. 1I after removing the resist and sufficient conductor material to expose the polymer layer and form interconnects having exposed contacts and in electrical contact with and touching the pockets. FIG. 1J shows removing most or all of resist 132, to form interconnect structures 140 of package 190. Removing resist 132 may include removing portions of layer 130 below resist 132, but not removing all of layer 136 or layer 130 within opening 122. For example, removing resist 132 may be described as flash etching, that leaves interconnect 140 separated by exposed surface 142 of layer 120, to form interconnect layer 150.

After FIG. 1J, processing may continue by returning to FIG. 1E where the contact of interconnect 140 replaces plating 114, for forming a second interconnect layer having second interconnects that connect to the contact surface of interconnect 140 in a similar manner that interconnect 140 connects to layer 114. Thus, FIGS. 1E-1J may be repeated to form interconnect layers 160, 170, and additional layers as described herein. Structure 190 shown in FIG. 1J may be described as a package, such as a single interconnect layer having interconnects 140 touching conductive contacts 114, which are touching panel 110. In some cases, panel 110 may be described as a "core" and thus, package 190 may be described as "cored". In other cases, panel 110 is temporary and will be removed leaving interconnect layer 150 which may be exposed, and thus described as a "coreless" package. In either case, it is contemplated that multiple interconnect layers of interconnects may be formed above interconnect layer 150 until a desired number of interconnect layers with interconnects are formed.

FIG. 2 shows an embodiment of a package having mirror image packages formed on opposing sides of a support base. FIG. 2 shows package 200 formed on support base 210. Package 200 include package 202 formed on a first surface of support base 210 and package 204 formed on an opposing surface of support base 210. Similarly, on the opposite surface of support 210 package 204 may include layer 110, interconnect layer 250, interconnect layer 260, and interconnect layer 270. Layers 250, 260, and 270 (and processors to form those layers) may be similar to the descriptions above for layers 150, 160, and 170. FIG. 2 also shows solder resists 220 formed on the exterior surface of, and in between interconnect contacts 140 of layer 170. Solder resists 220 may be a solder resist protective coating on the exterior surface of the package. Solder resists 220 may cause the flux spray to form only where the constraints do not exist, thus directing the spray material onto the contacts to form BGAs on and touching the contacts. The function of Solder resist (SR) is also to prevent any electrical shortage, such as to prevent shortage between interconnect contacts of layer.

After forming packages 202 and 204 on support base 210, the support base may be cut to separate package 202 from package 204. For example, packages 202 and 204 may be separated by cutting the edge of support base 210 to separate the top package 202 and bottom package 204. FIG. 2 also shows solder resist 230 formed on the exterior surface of (e.g., on surface 142), and in between interconnect contacts 140 of layer 170.

FIG. 3A shows an embodiment of the package shown in FIG. 1J (and/or a package of FIG. 2) after forming a total of three interconnect layers on the conductor panel. FIG. 3A shows package 300 including layers 110, 150, 160, and 170. Package 300 may represent the package of FIG. 1J, or either of packages 202 and 204.

FIG. 3B shows an embodiment of the package of FIG. 3A after removing the conductor panel. FIG. 3B shows package 302 after removing layer 110. Layer 110 may be formed by removal of the copper block by an etching process, as known in the art.

FIG. 3C shows an embodiments of the package of FIG. 3B after forming constraints on the surface of the interconnect layer exposed by removing the conductor panel. FIG. 3C shows package 304 after forming of constraints 330 on the surface of interconnect layer 150 (and interconnects thereof) where layer 110 was removed. FIG. 3C may be described as flipping interconnect 300 (e.g. the package or panel) and then forming panel constraints and then paste printing for ball grid array (BGA) attachments as known in the art. The panel constraints may cause the paste print to form only where the constraints do not exist, thus directing the solder material onto the copper interconnect contacts to form BGA interconnection after the reflow.

FIG. 3D shows an embodiment of the package of FIG. 3C after forming solder balls on the contacts exposed by removing the conductor panel. FIG. 3D shows package 306 after forming of solder bumps or balls 340 on exposed contacts of layer 150. FIG. 3D may include attaching microball solder in the small pockets between panel constraint 330 where flux spray adheres to contacts 114 of interconnects of layer 150. FIG. 3D may also include reflow of the solder attached to the flux to form the microballs.

It can be appreciated that FIGS. 1-3 may include forming one or more layers similar to layer 160 (e.g. layer 170) on layer 150. Moreover, it can be appreciated that FIGS. 1-3 may include forming hundreds or thousands of interconnects in each layer, such as formed on a wafer as known in the art. Thus, after FIG. 3D, discreet package die may be singulated, such as from a die or package (e.g. each package for a single IC chip).

Thus, FIGS. 1-3 show some embodiments of low height coreless packages manufactured using interconnect layers formed by a polymer as their dielectric in a direct laser and lamination process technology. This manufacturing process is process backend limited and therefore more expensive to manufacture than their "cored" counterparts (e.g. x-2-x, where 2x is the layer count for the coreless package), despite the coreless packages having two times the productivity. More particularly, some embodiments of Plan of Record (POR) coreless package processes, such as those shown in the FIGS. 1-3, start with a core, followed by pocket formation as shown in the FIGS. 1A-1D. One pocket formation that is specific to this type of process technology is known as Direct Lazer Lamination (DLL). Since dedicated and completely separate process equipment is needed for these processes, the package cost is highly driven by the increased cost of these equipment, as well as the lower volume of manufacturing (which is typically very low as the low Z-height is currently considered for MID segments (e.g., for handheld internet communication & computing devices).

In order to reduce the higher costs, bottleneck, and other problems of the pocket processing of FIGS. 1-3, additional embodiments are now described. For example, FIGS. 4-6 show embodiments of forming an integrated circuit chip package having through mold vias through a polymer block and into interconnects of an interconnect layer; and filling the through mold vias with solder to form bumps contacting the first interconnects and extending above the block. Thus, some of the embodiments described for FIGS. 4-6) reduce the higher costs, other problems, and bottleneck of the pocket processing of FIGS. 1-3 by forming the backend of the package using two separable polymer based molds, which after completion of the microball process are drilled with a laser to form the molded through vias (TMV). These TMVs are then filled with solder material by paste print process to enable the BGA interconnections. Embodiments of a detail process flow to enable this TMV based low height package are shown below in the FIGS. 4-6. In some cases, a TMV based low height package can be formed by a process shown in FIGS. 4-6 without or excluding the use dedicated and additional process equipment, such as required for FIGS. 1-3 (e.g., for FIGS. 1C, 1D, 3B and/or 3C). Specifically, FIGS. 1-3 packages do not have the through mold vias for package backend formation, as compared to FIGS. 4-6.

Figure 4A:
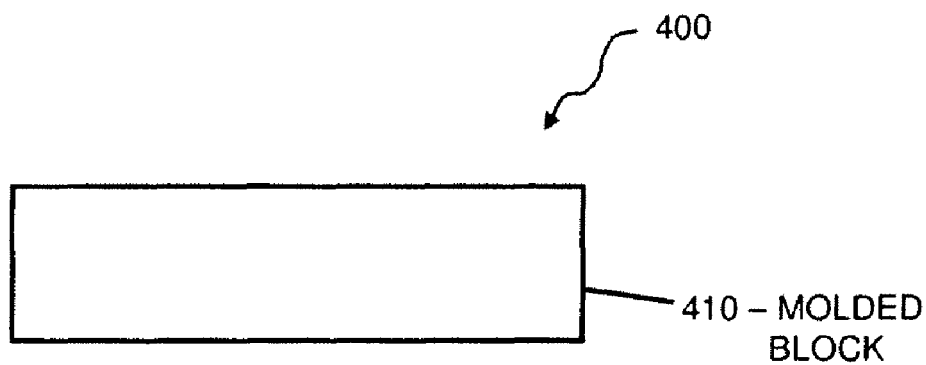
FIG. 4A shows a polymer block upon which interconnect layers of a package may be formed.
Figure 5:
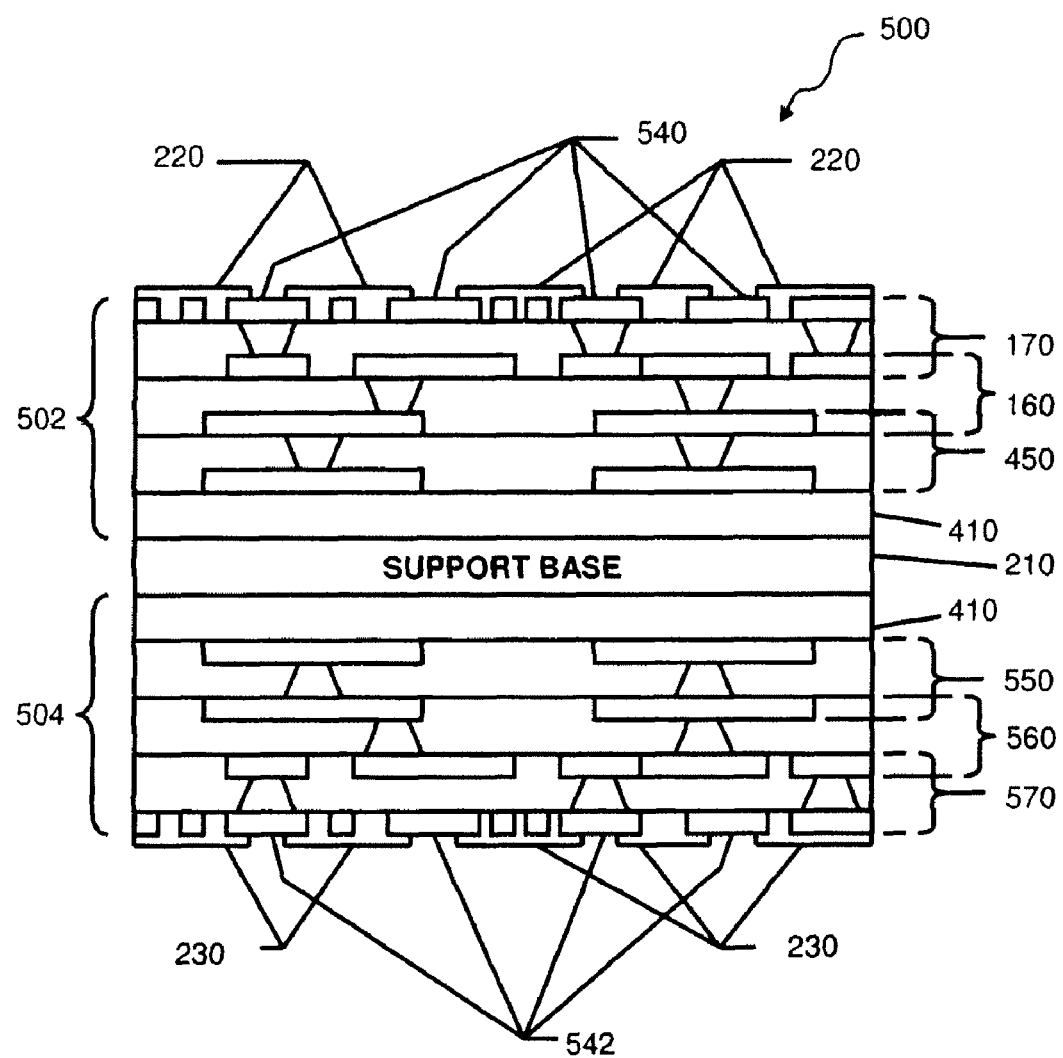
FIG. 5 shows an embodiment of a package having mirror image packages formed on opposing sides of a support base.

FIG. 4A shows a polymer block (e.g., core or panel) upon which interconnect layers of a package may be formed. FIG. 4A shows package 100 (e.g., a low height package) of a coreless package process beginning with polymer material block 410. In some embodiments, block 410 may represent a core of homogenous material, such as a block of polymer epoxy resin. For example, block 410 may be a molded block, such as a block of moulded polymer epoxy resin. Block 410 may have a thickness of approximately 35 microns. Block 410 may be a material and have a thickness so that during subsequent processing, through which TMVs maybe laser drilled through block 410 and filled with solder (e.g., by pasting) to form interconnect solder bumps.

Figure 4B:
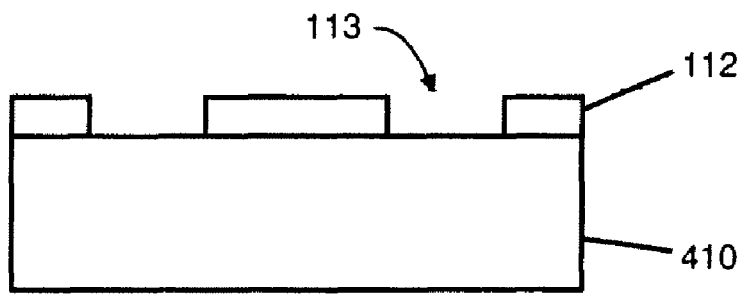
FIG. 4B shows an embodiment of the package of FIG. 4A after resist lamination and patterning.

FIG. 4B shows an embodiment of the package of FIG. 4A after resist lamination and patterning. In FIG. 4B, block 410 is laminated with resist 112, which is then etched to form contact openings 113.

Figure 4C:
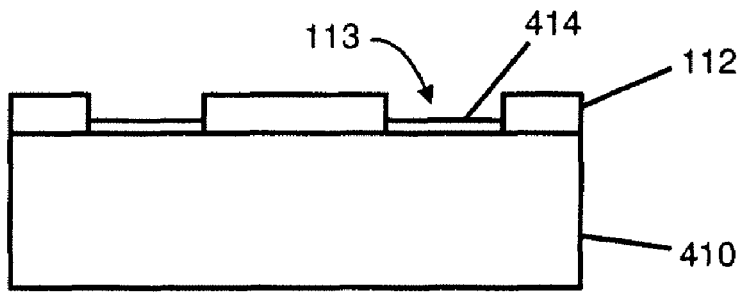
FIG. 4C shows an embodiment of the package of FIG. 4B after forming a selective polymer layer in each contact opening.

FIG. 4C shows an embodiment of the package of FIG. 4B after forming a selective polymer layer in each contact opening. In FIG. 4C, the exposed surface of block 410 within openings 113 is filled with selective polymer layer or "contacts" 414. In some embodiments, selective polymer layers 414 may be a nonconductive or semiconductive material shaped in the form of a contact but providing no electrical conduction or connectivity, such as for a signal.

Figure 4D:
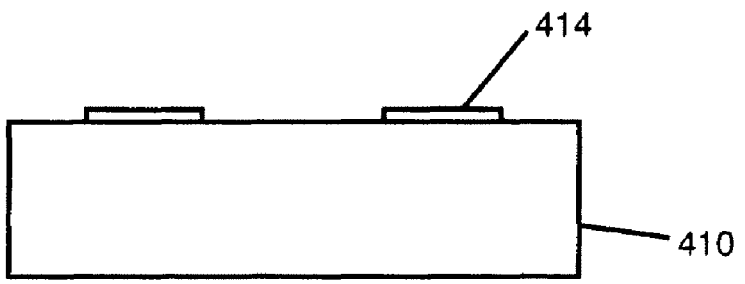
FIG. 4D shows an embodiment of the package of FIG. 4C after completely stripping the resist, thus, exposing the selective polymer and surface of the polymer block.

FIG. 4D shows an embodiment of the package of FIG. 4C after completely stripping the resist, thus, exposing the selective polymer and surface of the polymer block. FIG. 4D shows package 400 after resist 112 is stripped or completely etched from the surface of block 410, thus exposing layers 414 and the surface of block 410.

It can be appreciated that, as known in the art, the processes shown in FIGS. 4B-4D to form contacts 414 are less expensive and less time consuming than those to form contacts 114. Forming a selective polymer layers 414 may exclude or not require plating with a conductor or metal, such as shown above to form pockets or contacts 114. For example, formation of contacts 414 may exclude or not require metal, alloy, or conductive material as described above for forming contacts 114. Thus, the cost of forming contacts 414 may exclude the cost of those materials for forming layer 114. Similarly, the processing to form contacts 414 may include polymer lamination and/or selective polymer deposition. In some cases, formation of contacts 414 may be excluded and polymer layer 116 may be formed directly on the exposed surface of polymer 410, without processes shown in FIGS. 4B-4D. In either case, specific equipment for forming, plating, or electrolytic plating to form contacts 114 is not required in FIGS. 4-7. The expense for the equipment and time to form contacts 114 is not required in FIGS. 4C-D.

FIGS. 4E-4J describe additional processing for forming the coreless package. Such processing may be common to "cored" as well as "coreless" processes.

Figure 4E:
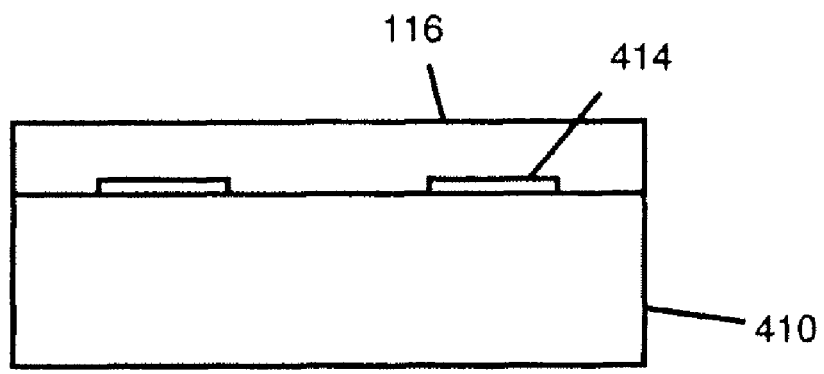
FIG. 4E shows an embodiment of the package of FIG. 4D after laminating the surface of the selective polymer and the polymer block with a polymer blanket layer.

FIG. 4E shows an embodiment of the package of FIG. 4D after laminating the surface of the selective polymer and the polymer block with a polymer blanket layer. FIG. 4E shows package 400 after the surface of block 410 and polymer 414 are coated with a polymer lamination 116. For example, layer 116 may be a blanket deposition of polymer or ABF, as known in the industry. Layer 116 may be formed as a film of polymer, such as by ABF lamination. Layer 116 may be formed on exposed surfaces of block 410 and on layers 414 by lamination, such as applying a film of polymer 116 onto and touching the surface of block 410 and hot pressing the film onto the surface at a temperature of approximately 170 centigrade.

Figure 4F:
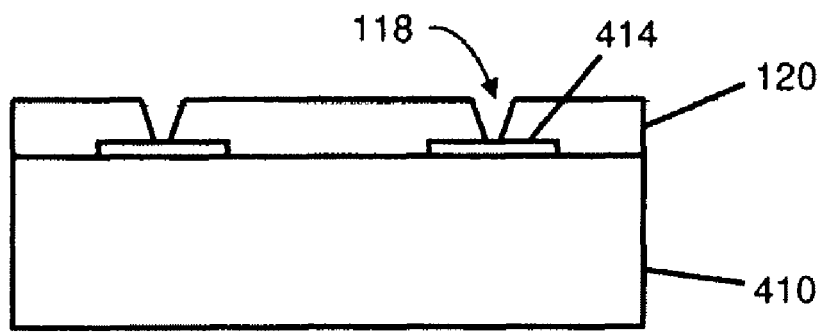
FIG. 4F shows an embodiment of the package of FIG. 4E after forming vias through the polymer lamination and to the selective polymer "contacts".

FIG. 4F shows an embodiment of the package of FIG. 4E after forming vias through the polymer lamination and to the selective polymer "contacts". FIG. 4F shows forming vias in and through layer 116 and to contacts 414 to create layer 120. For example, vias 118 may be formed by via drilling, such as by laser, to form an opening having a profile larger at the top of layer 120 and smaller in width at the bottom of layer 120, such as a conical profile larger at the top than at the bottom.

Figure 4G:
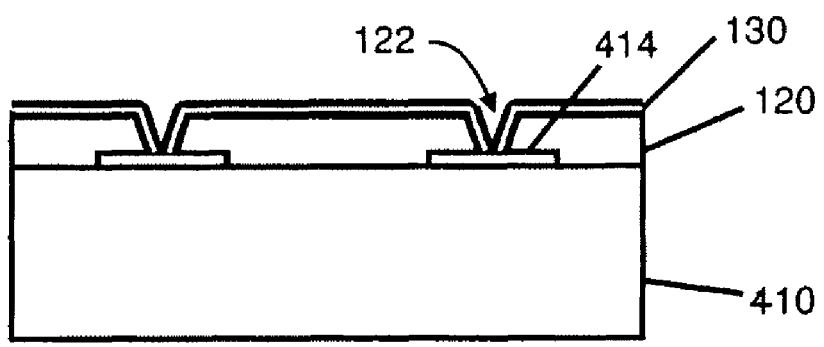
FIG. 4G shows an embodiment of the package of FIG. 4F after forming a conformal layer of conductive material on the surface of the polymer lamination, in the vias, and to the selective polymer contacts.

FIG. 4G shows an embodiment of the package of FIG. 4F after forming a conformal layer of conductive material on the surface of the polymer lamination, in the vias, and to the selective polymer contacts. FIG. 4G shows forming a conformal layer of conductive interconnect material 130 onto the exposed surfaces of layer 116, via 118, and contact 414 at the bottom of via 118. Forming layer 130 may form via fill opening 122 within via 118 above layer 130. Layer 130 may be filmed by electroless plating, such as to plate a metal. Appropriate conductors include copper, nickel, gold, gold, palladium, an alloy thereof, and the like as known in the industry.

Figure 4H:
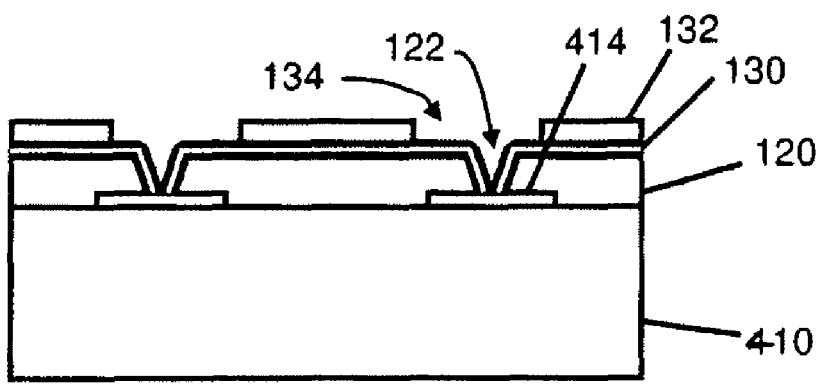
FIG. 4H shows an embodiment of the package of FIG. 4G after further resist lamination and patterning.

FIG. 4H shows an embodiment of the package of FIG. 4G after further resist lamination and patterning. FIG. 4H shows the surface of layer 130 laminated with resist 132; and resist 132 etched to form interconnect fill openings 134 in layer 132 and above layer 130. Openings 134 include openings 122. Forming openings 134 may be described as patterning layer 132. Openings 134 may extend wider than opening 122, but do not extend to an adjacent opening 122 for a separate via.

Figure 4I:
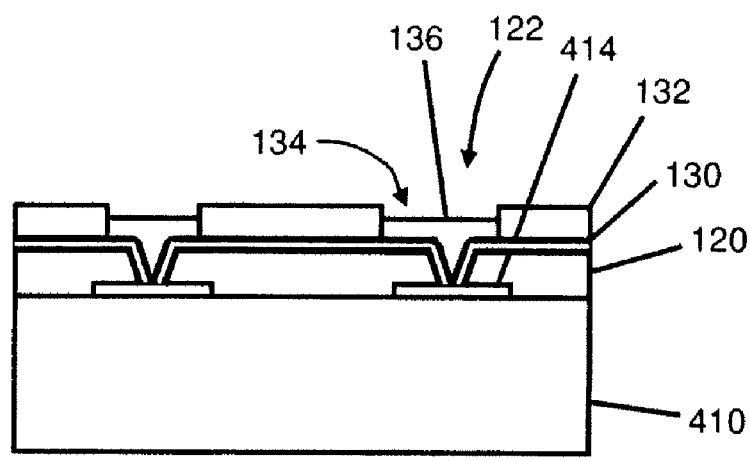
FIG. 4I shows an embodiment of the package of FIG. 4H after forming additional conductive material in openings of the resist to form interconnects.

FIG. 4I shows an embodiment of the package of FIG. 4H after forming additional conductive material in openings of the resist to form interconnects. FIG. 4I shows filling openings 134 with a conductive interconnect material to form interconnect. Appropriate conductors include copper, nickel, gold, gold, palladium, an alloy thereof, and the like as known in the industry. For example, opening 134 may be ALD deposited, electrolytic plated, or electroless plated with copper, nickel, gold, silver or an alloy thereof to fill in a thickness, or all of opening 134, including opening 122 in a blanket layer. In some embodiments, FIG. 4I may represent via fill plating, as known in the industry.

Figure 4J:
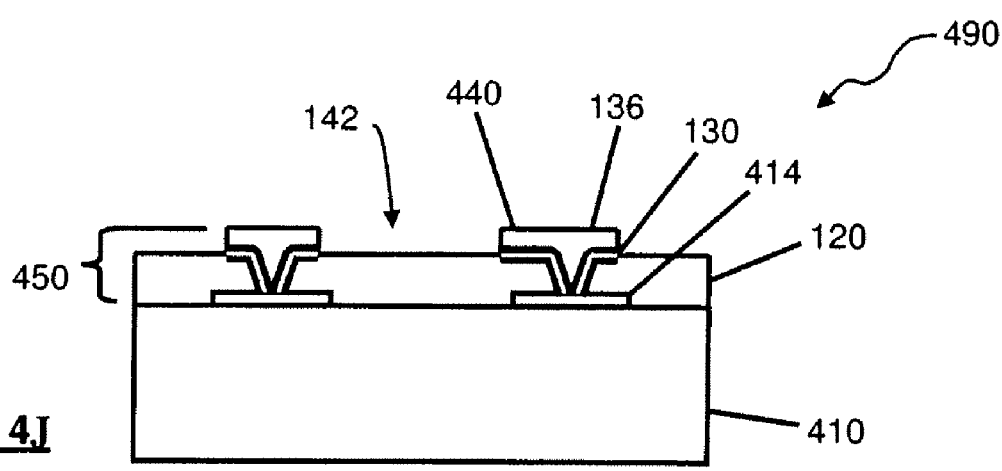
FIG. 4J shows an embodiment of the package of FIG. 4I after removing the resist and sufficient conductor material to expose the polymer layer and form interconnects having exposed contacts and in electrical contact with and touching the pockets.

FIG. 4J shows an embodiment of the package of FIG. 4I after removing the resist and sufficient conductor material 130 to expose the polymer layer and form interconnects having exposed contacts and in electrical contact with and touching the pockets. FIG. 4J shows removing most or all of resist 132, to form interconnect structures 440 of package 490. Removing resist 132 may include removing portions of layer 130 below resist 132. In some cases, removing portions of layer 132 may include removing most or all of the thickness of layer 130 below resist 132, removing some or all of the thickness of layer 136 in opening 134, but not removing all of layer 136 or layer 130 within opening 122. For example, removing resist 132 may be described as flash etching, that leaves interconnect 440 within openings 122 and extending above the top surface of layer 120 to provide contacts above each via that extend as interconnects to and connect with layer 414 to form interconnect layer 450 having interconnects 440 separated by exposed surface 142 of layer 120.

After FIG. 4J, processing may continue by returning to FIG. 4E where the contacts of interconnects 440 replace layers 414, for forming a second interconnect layer having second interconnects that connect to the contact surface of interconnect 440 in a similar manner that interconnects 440 connect to layers 414. Thus, FIGS. 4E-4J may be repeated to form interconnect layers 460, 470, and additional layers as described herein. Structure 490 shown in FIG. 4J may be described as a package, such as a single interconnect layer having interconnects 440 touching conductive contacts 414, which are touching block 410. In some cases, block 410 may be described as a "core" and thus, package 490 may be described as "cored". In other cases, block 410 will have openings formed through it (e.g., through mold vias) and into the interconnect layer (e.g., to interconnects 440); and the openings will be filled with electrically conductive material (e.g., solder bumps) contacting the interconnects and extending above the block. In these other cases, block 410 and interconnect layer 450 may be described as a "coreless" package. In either case, it is contemplated that multiple interconnect layers of interconnects may be formed above interconnect layer 450 until a desired number of interconnect layers with interconnects are formed.

FIG. 5 shows an embodiment of a package having mirror image packages formed on opposing sides of a support base. FIG. 5 shows package 500 formed on support base 210. Package 500 includes package 502 formed on a first surface of support base 210 and package 504 formed on an opposing surface of support base 210. Package 502 may include block 410, interconnect layer 450, interconnect layer 460 formed on and touching (and having interconnects on and touching interconnects of) layer 450. Interconnect layer 470 may be formed on and touching (and may have interconnects formed on and touching interconnects of) layer 460. Layers 460 and 470 may be formed similar to and may be interconnect layers having interconnects similar to the descriptions above for layer 450 (e.g. see FIGS. 4E-4J). FIG. 5 also shows solder resist 220 formed on the exterior surface of (e.g., on surface 442), and in between interconnect contacts 540 of layer 470.

Similarly, on the opposite surface of support 210 package 504 may include block 410, interconnect layer 550, interconnect layer 560, and interconnect layer 570. Layers 550, 560, and 570 (and processors to form those layers) may be similar to the descriptions above for layers 450, 460, and 470. FIG. 5 also shows solder resist 230 formed on the exterior surface of, and in between interconnect contacts 542 of layer 570.

After forming packages 502 and 504 on support base 210, the support base may be cut to separate package 502 from package 504. For example, packages 502 and 504 may be separated by cutting the edge of support base (e.g., "panel") 210 to separate the top and bottom parts (e.g. separate package 502 from package 504). In some embodiments, such cutting and separation may use processes know in the industry.

Figure 6A:
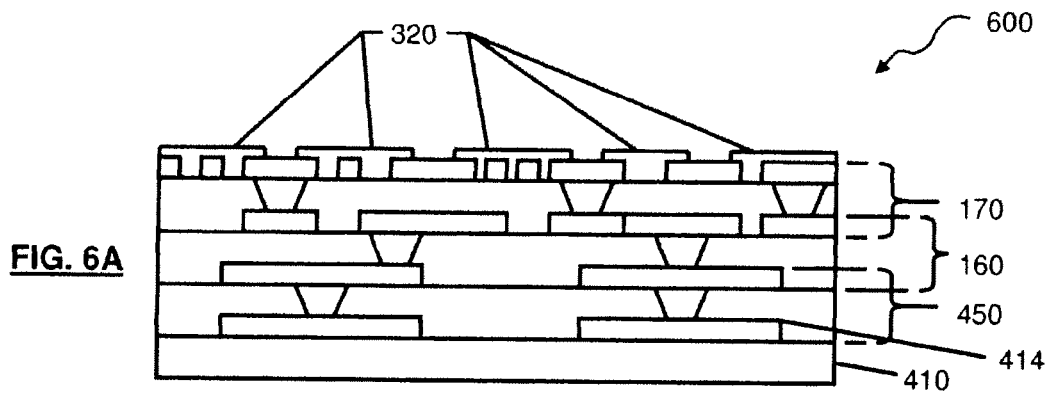
FIG. 6A shows an embodiment of the package shown in FIG. 4J (and/or a package of FIG. 5) after forming a total of three interconnect layers on the conductor panel.

FIG. 6A shows an embodiment of the package shown in FIG. 4J (and/or a package of FIG. 5) after forming a total of three interconnect layers on the conductor panel. FIG. 6A shows package 600 including layers 410, 450, 460, 470 and solder resist 220. Package 600 may represent the package 490, package 502, and/or package 504.

Figure 6B:
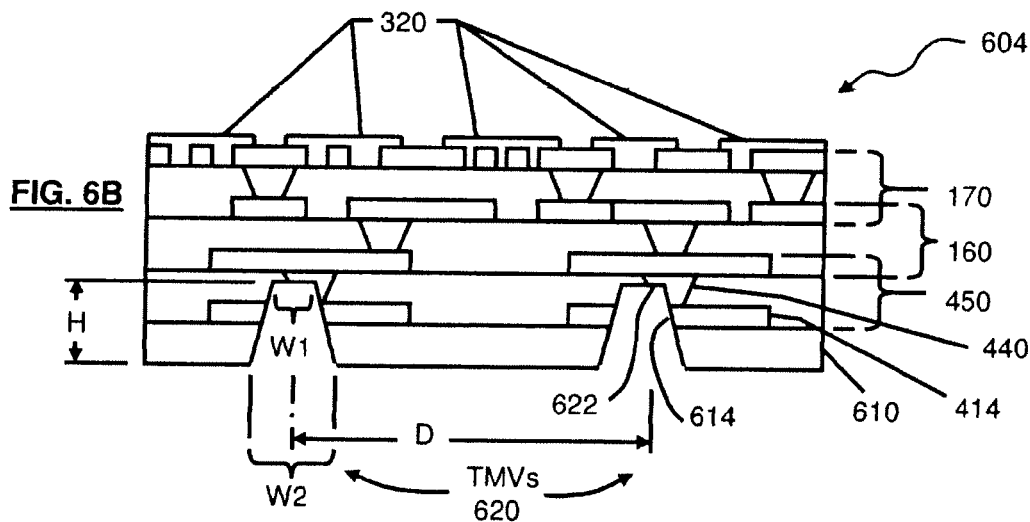
FIG. 6B shows an embodiment of the package shown in FIG. 6A after forming through mold vias (TMVs) through the polymer block and into contacts and/or interconnects of the interconnect layer.

FIG. 6B shows an embodiment of the package shown in FIG. 6A after forming through mold vias (TMVs) through the polymer block and into contacts and/or interconnects of the interconnect layer. FIG. 6B shows TMVs 620 formed through block 610, through contacts 414 and into interconnects 440 of layer 450. TMVs 620 may be lined up with all or the desired interconnects 440 of layer 450. Specifically, the location of each of TMVs 620 may be selected or predetermined to electrically (and/or physically) attach a contact of a motherboard (or motherboard interface) to a selected interconnect 440 of layer 450. Thus, the TMVs may penetrate through layer 414 and into interconnect 440 of layer 150.

TMVs 620 are shown at extending through and exposing surface 614 of contact 414. TMVs 620 are also shown at extending into and exposing surface 622 of conductive material of interconnect 440. TMVs 620 may have a "funnel" shape. For example, TMVs 620 may have a lower width W1 exposing at least a portion or surface of interconnect 440 and an upper width W2 at the exposed surface of block 610. Width W1 may be a width of between 50 and 8 microns; and width W2 may be a width of between 70 and 100 microns. FIG. 6B also shows distance D between the center point of adjacent TMVs 620. Distance D may be a distance between 125 and 150 microns. TMVs 620 may also have a height, such as a height from width W1 to width W2, or a height from the surface of block 610 to the bottom of the TMV or the exposed surface of interconnect 440. Height H may be between 80 and 150 microns. In some cases, height H may be between 60 and 100 microns. Also, a thickness for the polymer block 610 may be equal to or approximately 100 um.

TMVs 620 may be formed by laser drilling through block 610 and into interconnect layer 450. For example, block 610 and interconnect layer 450 may be drilled using a laser that heats material of the block and interconnect layer until the material is evaporated and metal of interconnect 414 is exposed. Appropriate lasers include a CO2 laser, and/or a chamber such as a Hitachi™ laser machine. Laser drilling of various materials, such as those of layer 410 and layer 150, to form the TMVs having dimensions noted above may be done by processes know in the art, such as for laser drilling various chip and chip package composite materials.

It is noted that FIG. 6B shows package 604 excluding or without removal of layer 410. Thus, the process, time, cost and equipment needed for removing the conductor panel 110 as described for FIG. 3B are not required in FIG. 6. Similarly, FIG. 6B does not require or excludes forming constraints on the surface of interconnect layer 450. Thus, the process, time, cost and equipment needed for forming constraints on layer 450 as described for FIG. 3C are not required in FIG. 6.

Figure 6C:
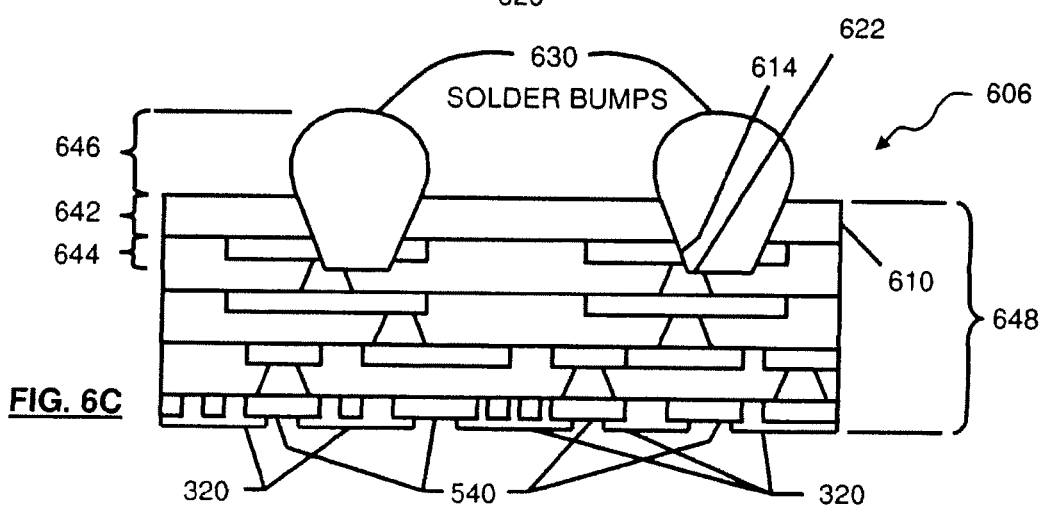
FIG. 6C shows an embodiment of the package of FIG. 6B after forming solder bumps in the TMVs.

FIG. 6C shows an embodiment of the package of FIG. 6B after forming solder bumps in the TMVs. Solder may be formed in the TMVs, to the interconnects, and forming solder bumps above the exposed surface of the polymer block. For example, FIG. 6C shows solder bumps 630 formed in and touching layer 610, layer 614 and interconnect 640. Thus, solder bumps 630 extend above the exposed surface of block 620 by height 646; extend through block 610 by height 642; and extend into interconnect 440 by height 644. In some cases, height 642 plus height 644 may be between 60 and 100 microns. In some cases, height 646 may between 100 and 200 microns. For example, height 646 may be equal to or approximately 150 um. Moreover, it can be noted that solder bumps 630 have a longer "conical" section extending further into layer 450 than bumps 340 which are only formed onto the contacts 114 of layer 150. Thickness 648 of package 606 may be approximately 0.4 mm. In some cases the thickness may be between 200 and 400 microns.

Solder bumps shown in FIG. 6C may be formed by a solder paste and print process. For example, the package shown in FIG. 6B may be flipped upside down and a solder paste and print process may form solder bumps 630 within the TMVs and extending above the exposed surface of layer 614. In some cases, solder to form solder bumps 630 is screen printed into the TMVs, or a stenciled predrilled mask is lined up and then the solder is printed into the TMVs. The solder may be printed at a temperature of between 200 and 250 degrees Celsius.

To screen print the solder, a screen may be printed on the exposed surface of block 610. The screen may be a mask that is then stenciled, or may be predrilled. Openings in the screen may be lined up with TMV 620. For example, the solder may be mechanically squeezed or squeegeed into openings 620 (with or without a mask). Mechanically squeezing or sqeegeeing the solder may be described as flowing the solder with flux, such as organic flux. If a stencil is used, the stencil may then be removed. After removing the stencil, the solder may be reflowed at a melting temperature of the solder. For example, the solder may be reflowed for three to four hours. The solder may be reflowed at a temperature of between 200 and 250 degrees Celsius, the solder may be reflowed at a temperature of 220 degrees Celsius. Reflowing may also flux volatilize gases in the solder causing them to evaporate.

Appropriate solder for bumps 630 includes SAC 305™ as known in the industry. For example, the solder may be a titanium silver copper mix having 0.5% Cu, Silver 3% and tin 96.5%. The solder may also be a tin antimony copper and silver mixture. In some cases, the solder is a tin antimony based alloy; in some cases the solder may be a lead based solder. It can be appreciated that various compositions of solder may be used, and that the temperatures mentioned above may vary depending on the composition of the solder. Thus, the processes described above with respect to forming solder bumps 630 may be described as via fill by solder paste and print.

It can be appreciated that FIGS. 4-6 may include forming one or more layers similar to layer 460 (e.g. layer 470) on layer 450. Thus, a package similar to package 606 can be produced with one, two, three, four, five, six, or more than six interconnect layers. Moreover, it can be appreciated that FIGS. 4-6 may include forming hundreds or thousands of interconnects in each layer, such as formed on a wafer as known in the art. Thus, after FIG. 6C, discreet package die may be singulated, such as from a die or package (e.g. each package for a single IC chip).

As compared to the package of FIG. 3B the packages of FIGS. 4J and 6 may enjoy the benefit of increased structural strength, and reduced warpage. For example, as compared to the requirement of removing panel 110 in FIG. 3B, the packages noted above allow block 610 to remain on the package and processing package wafer or panel, thus: (1) reducing package warpage after the packages are diced; (2) reducing panel and package warpage before the packages are diced. In addition, by allowing block 610 to remain attached to interconnect layer 150 and forming vias 620 through block 610, solder bumps 630 may use more solder than bumps 340 of FIG. 3D, such as to provide benefits including: (1) improved connectivity between the package and a motherboard or motherboard interface due to the additional paste of bumps 630 as compared to bumps 340, and due to better solder formation and reflow control for the increased solder bumps.

In addition, some embodiments described (e.g., FIGS. 4-6) provide a low height package at a lower (affordable) cost in comparison to FIGS. 1-3, by using through mold via (TMV) formed through a polymer block. These embodiments (e.g., FIGS. 4-6) may provide an alternative low height package at an affordable cost and with same Design Rule (e.g. similar feature size, processing equipment and some similar processes) benefits as that of FIGS. 1-3. These embodiments may eliminate the limitation of backend process of FIGS. 1-3 by enabling through mold vias (TMV), where BGA interconnections are directly enabled by paste printing the solder into the mold vias. These embodiments may effectively eliminate the pocket formation of the DLL process technology (e.g., FIGS. 1-3) and therefore the packages are likely to be cheaper. Moreover, these embodiments may provide increased adhesion and/or electrical contact between interconnects of the interconnect layer (e.g., layer 450) and the solder bumps 630 of FIGS. 6-7, as compared to the solder balls 340 on contacts 114 of FIGS. 2-3.

Overall, as compared to FIGS. 1-3, usage of the technology of FIGS. 4-6 can allow the MID (e.g., handheld internet communication & computing devices) and other low height packages to be much more cost effective. In some embodiments, the technology of FIGS. 4-6 may be used in various products, which required low height packages.

Figure 7:
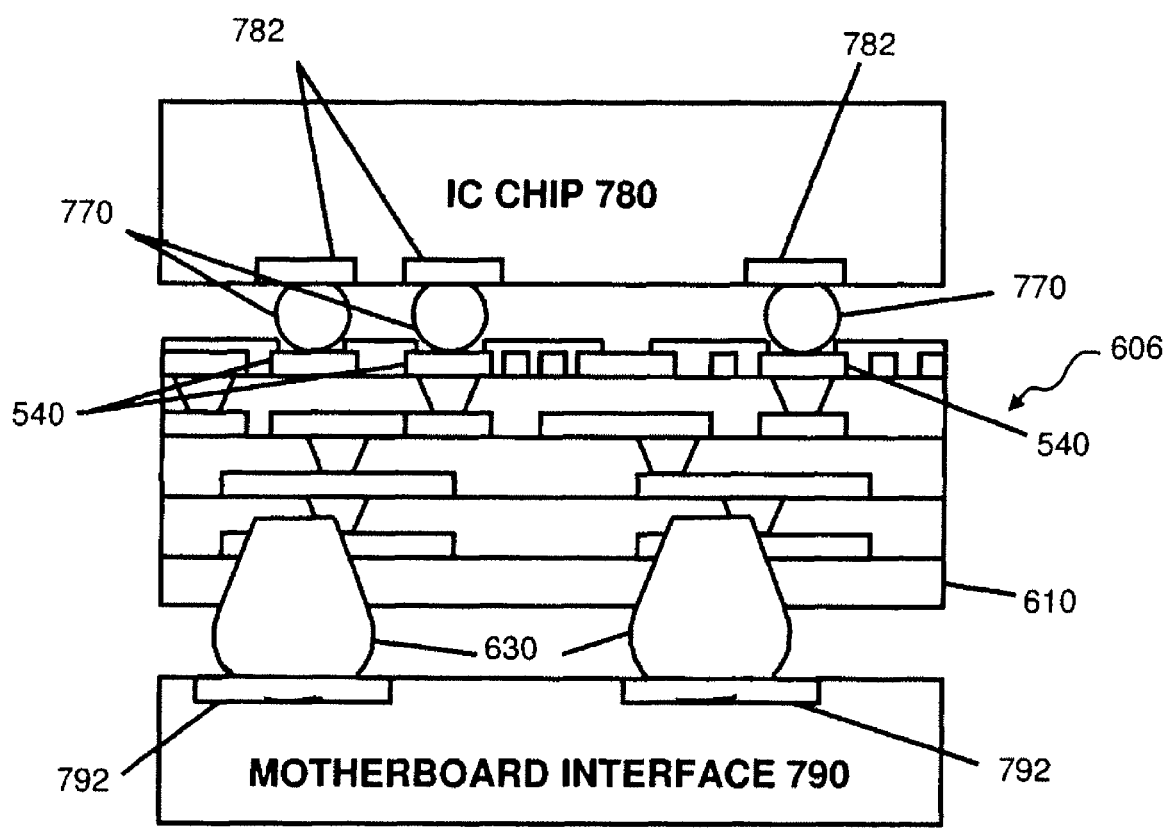
FIG. 7 shows an embodiment of a package of FIG. 6C after attaching and electrically coupling an IC chip to solder bumps formed on the final interconnect layer, and attaching and electrically coupling a motherboard to the solder bumps formed in the TMVs.

For example, FIG. 7 shows an embodiment of a package of FIG. 6C after attaching and electrically coupling an IC chip to solder bumps formed on the final interconnect layer, and attaching and electrically coupling a motherboard to the solder bumps formed in the TMVs. FIG. 7 shows package 606 having contacts 540 attached and electrically coupled to contacts 782 of IC chip 780 using solder balls 770. Package 606 also has bumps 630 attached and electrically coupled to contacts 792 of motherboard interface 790. Motherboard interface 790 may be part of the motherboard, or a separate motherboard interface.

While certain embodiments have been described and shown in the accompanying drawings, it is to be understood that such embodiments are merely illustrative of and not restrictive on the broad embodiments of the invention, and that embodiments of the invention are not limited to the specific constructions and arrangements shown and described, since various other modifications may occur to those of ordinary skill in the art. The description is thus to be regarded as illustrative instead of limiting.

What is claimed is:

1. A method of forming an integrated circuit chip package comprising:
    forming a first interconnect layer on and touching a molded polymer block, wherein the first interconnect layer comprises a first plurality of interconnects through a first polymer layer and to the block, wherein forming the first interconnect layer comprises:
        laminating the first surface with a first resist;
        etching the first resist to form contact openings;
        forming a selective polymer layer in each of the contact openings;
        removing the first resist;
        laminating a first blanket layer of polymer over the block and over the selective polymer layers;
        forming first vias in the blanket layer of polymer and to the selective polymer layers;
        forming a first layer of first conductive interconnect material in the first vias and to the selective polymer layers; and
    forming at least one second interconnect layer on and touching the first interconnect layer, wherein the second interconnect layer comprises a second plurality of interconnects through a second polymer layer and to the first plurality of interconnects of the first interconnect layer.

2. The method of claim 1, wherein the block is a first block formed on a support base, and the first interconnect layer and is formed on and touching a first surface of the first block; and further comprising:
    forming a third interconnect layer on and touching a second block formed on a second side of the support base opposite the first side, wherein the third interconnect layer comprises a third plurality of interconnects through a third polymer layer and to the second side of the block; and
    forming at least one fourth interconnect layer on and touching the third interconnect layer, wherein the fourth interconnect layer comprises a fourth plurality of interconnects through a fourth polymer layer and to the third plurality of interconnects of the third interconnect layer.

3. The method of claim 1,
    wherein forming the first conductive interconnect material includes forming one via fill openings within each via.

4. A method of forming an integrated circuit chip package comprising:
    forming a first interconnect layer on and touching a molded polymer block, wherein the first interconnect layer comprises a first plurality of interconnects through a first polymer layer and to the block;
    forming at least one second interconnect layer on and touching the first interconnect layer, wherein the second interconnect layer comprises a second plurality of interconnects through a second polymer layer and to the first plurality of interconnects of the first interconnect layer, wherein the block is a first block formed on a support base, and the first interconnect layer and is formed on and touching a first surface of the first block;

forming a third interconnect layer on and touching a second block formed on a second side of the support base opposite the first side, wherein the third interconnect layer comprises a third plurality of interconnects through a third polymer layer and to the second side of the block;

forming at least one fourth interconnect layer on and touching the third interconnect layer, wherein the fourth interconnect layer comprises a fourth plurality of interconnects through a fourth polymer layer and to the third plurality of interconnects of the third interconnect layer; and then cutting the support base to separate the first surface from the second side.

5. A method of tiring an integrated circuit chip package comprising:

forming a first interconnect layer on and touching a molded polymer block, wherein the first interconnect layer comprises a first plurality of interconnects through a first polymer layer and to the block:

forming at least one second interconnect layer on and touching the first interconnect layer, wherein the second interconnect layer comprises a second plurality of interconnects through a second polymer layer and to the first plurality of interconnects of the first interconnect layer; and then forming a plurality of through mold vias through the block, into the first interconnect layer, and to the first interconnects.

6. A method of forming an integrated circuit chip package comprising:

forming a first interconnect layer on and touching a molded polymer block, wherein the first interconnect layer comprises a first plurality of interconnects through a first polymer layer and to the block;

forming at least one second interconnect layer on and touching the first interconnect layer, wherein the second interconnect layer comprises a second plurality of interconnects through a second polymer layer and to the first plurality of interconnects of the first interconnect layer;

forming a plurality of through mold vias through the block, into the first interconnect layer, and to the first interconnects; and forming a plurality of solder bumps (a) into the through mold vias, (b) touching first interconnects of the first interconnect layer, and (c) extending as solder bumps above the block.

7. The method of claim 6 wherein forming through mold vias comprises:

laser drilling the through mold vias into the first interconnect layer and to the first interconnects; and wherein forming the solder humps comprises:

paste printing the solder into the through mold vias and to the first interconnects; and then reflowing the solder.

8. The method of claim 6 further comprising:

singulating the block and interconnect layers into packages:

electrically attaching a motherboard to the solder humps extending above the block;

forming solder halls on the second interconnect layer; and electronically attaching an integrated circuit chip to the second interconnects of the second interconnect layer using the solder halls.

\* \* \* \* \*